(12) United States Patent
Jeong et al.

(10) Patent No.: US 11,418,142 B2
(45) Date of Patent: Aug. 16, 2022

(54) MOTOR-DRIVING APPARATUS

(71) Applicants: Hyundai Motor Company, Seoul (KR); Kia Motors Corporation, Seoul (KR)

(72) Inventors: Kang Ho Jeong, Gyeonggi-do (KR); Jong Kyong Lim, Gyeonggi-do (KR); Suk Hyun Lim, Gyeonggi-do (KR); Ji Woong Jang, Gyeonggi-do (KR); Beom Sik Kim, Gyeonggi-Do (KR); Sang Cheol Shin, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 17/086,614

(22) Filed: Nov. 2, 2020

(65) Prior Publication Data
US 2021/0305928 A1 Sep. 30, 2021

(30) Foreign Application Priority Data
Mar. 30, 2020 (KR) .................. 10-2020-0038230

(51) Int. Cl.
*H02P 1/26* (2006.01)
*H02P 27/08* (2006.01)
*H02P 25/18* (2006.01)
*H02M 7/5387* (2007.01)
*B60L 50/51* (2019.01)
(Continued)

(52) U.S. Cl.
CPC .............. *H02P 27/08* (2013.01); *B60L 15/08* (2013.01); *B60L 50/51* (2019.02); *G01R 19/16538* (2013.01); *H02M 7/53871* (2013.01); *H02P 25/184* (2013.01); *B60L 2220/54* (2013.01)

(58) Field of Classification Search
CPC ........ H02P 27/08; H02P 25/184; H02P 27/06; B60L 50/51; B60L 15/08; B60L 2220/54; G01R 19/16538; H02M 7/53871
See application file for complete search history.

(56) References Cited

U.S. PATENT DOCUMENTS 4,160,938 A * 7/1979 Akamatsu ............... H02P 27/06
  318/722
5,352,964 A 10/1994 Nakamura et al.
(Continued)

FOREIGN PATENT DOCUMENTS

EP 2 797 221 A1 10/2014
JP 6087666 B2 3/2017
(Continued)

*Primary Examiner* — Karen Masih
(74) *Attorney, Agent, or Firm* — Fox Rothschild LLP

(57) ABSTRACT

A motor-driving apparatus for driving a motor having a plurality of windings respectively corresponding to a plurality of phases is provided. The motor-driving apparatus includes a first inverter having a plurality of first switching devices and connected to first ends of the plurality of windings and a second inverter having a plurality of second switching devices and connected to second ends of the plurality of windings. A third switching device is configured to selectively connect and disconnect points at which a number of turns of each of the windings is divided in a preset ratio. A controller is configured to adjust an on/off state of the first to third switching devices based on required output of the motor.

10 Claims, 2 Drawing Sheets

(51) Int. Cl.
    *G01R 19/165*     (2006.01)
    *B60L 15/08*      (2006.01)

(56) References Cited

U.S. PATENT DOCUMENTS

| | | |
|---|---|---|
| 8,054,032 B2 | 11/2011 | Chakrabarti et al. |
| 8,482,230 B2 | 7/2013 | Bouchez et al. |
| 2009/0033253 A1 | 2/2009 | Nagashima et al. |
| 2011/0234139 A1 | 9/2011 | Hsu |

FOREIGN PATENT DOCUMENTS

| | | |
|---|---|---|
| JP | 6285256 B2 | 2/2018 |
| JP | 2019047670 A | 3/2019 |

\* cited by examiner

MOTOR-DRIVING APPARATUS

CROSS-REFERENCE TO RELATED APPLICATION

This application claims the priority benefit of Korean Patent Application No. 10-2020-0038230, filed on Mar. 30, 2020, the disclosure of which is incorporated herein by reference.

BACKGROUND

1. Field of the Disclosure

The present disclosure relates to a motor-driving apparatus, and more particularly to a motor-driving apparatus for converting a current mode into a motor-driving mode, a Y-connected motor-driving mode, and an open-end winding motor-driving mode based on the required output of a motor, thereby improving efficiency of an inverter for driving the motor.

2. Description of the Related Art

Generally, one-side ends of windings in respective phases included in a motor are connected to one inverter, and other-side ends of the windings are connected to each other to form a Y-connection. When a motor is driven, a switching device in the inverter generates torque by applying a line voltage to a winding of a Y-connected motor to generate alternating current (AC) current while being turned on/off via pulse-width modulation control.

The fuel efficiency of an eco-friendly vehicle, such as an electric vehicle using, as power, torque generated by such a motor, is determined in part by the power conversion efficiency of the inverter and the motor, and thus, it is important to maximize the power conversion efficiency of the inverter and the efficiency of the motor to improve fuel efficiency. The efficiency of an inverter-motor system is mainly determined by the voltage utilization rate of the inverter, and in this regard, when a driving point of a vehicle determined based on the relationship between motor speed and torque is formed in a section with a high voltage utilization rate, the fuel efficiency of the vehicle is improved.

However, when the number of windings of the motor is increased to increase the maximum torque of a motor, a section with a high voltage utilization rate is distant from a low-torque region, which is the main driving point of the vehicle, thus degrading degrade fuel efficiency. In addition, in terms of fuel efficiency, when the system is designed to cover a main driving point in a section with a high voltage utilization rate, acceleration and propulsion performance of the vehicle is degraded due to the restriction on the maximum torque of the motor. Accordingly, there is a need for motor-driving technology of improving the efficiency of a system while covering both low-output and high-output sections using one motor in the field of the related art.

It will be understood that the above matters described in the related art are merely for promotion of understanding of the background of the invention, and should not be recognized as prior art that is well-known to those skilled in the art.

SUMMARY

Therefore, the present disclosure provides a motor-driving apparatus for converting a current mode into a motor-driving mode, a Y-connected motor-driving mode, and an open-end winding motor-driving mode based on the required output of a motor and improving the efficiency of an inverter for driving the motor.

In accordance with an aspect of the present disclosure, the above and other objects may be accomplished by the provision of a motor-driving apparatus for driving a motor having a plurality of windings corresponding to a plurality of phases, respectively, including a first inverter having a plurality of first switching devices and connected to first ends of the plurality of windings, a second inverter having a plurality of second switching devices and connected to second ends of the plurality of windings, a third switching device configured to selectively connect and disconnect points at which a number of turns of each of the windings is divided in a preset ratio, and a controller configured to control an on/off state of the first to third switching devices based on a required output of the motor.

The third switching device may include a plurality of switching devices having one-side ends (e.g., first-side ends) connected to points at which a number of turns of each of the plurality of windings is divided in the preset ratio, respectively, and the other-side ends (e.g., second-side ends) connected to each other. When the required output of the motor is less than a preset reference value, the controller may be configured to turn on the third switching device and drive the motor by performing pulse-width modulation control on the first switching device. The preset ratio may be N1:N2, and a coil with a number of turns corresponding to the N1 may be connected to the first inverter in a form of a Y-connection by turning on the third switching device.

The N1 may be determined to make a region corresponding to a main driving point of a vehicle to which the motor is applied belong to a region in which a voltage utilization rate of the inverter is equal to or greater than a preset reference value, at which the voltage utilization rate of the inverter is determined to be optimized, in a motor-revolutions-per-minute (RPM)/motor-torque relationship. When the required output of the motor is greater than a preset reference value, the controller may be configured to turn off the third switching device and may drive the motor by performing pulse-width modulation control on the first switching device and the second switching device.

The preset ratio may be N1:N2, and opposite ends of a coil having a number of turns corresponding to N1+N2 may be connected to the first and second inverters by turning off the third switching device, and the motor may be driven as an open-end winding motor. The first switching device may be formed of a material characterized by relatively low switching loss compared with the second switching device. The first switching device may be MOSFET formed of SiC, and the second switching device may be IGBT formed of Si.

In accordance with another aspect of the present disclosure, a motor-driving apparatus for driving a motor having a plurality of windings corresponding to a plurality of phases, respectively, may include a first inverter having a plurality of first switching devices and connected to first ends of the plurality of windings, a second inverter having a plurality of second switching devices and connected to second ends of the plurality of windings, a plurality of third switching devices having one-side ends connected to points at which a number of turns of the plurality of windings is divided in a preset ratio, respectively, and having other-side ends connected to each other, and a controller configured to form a Y-connection by turning on the plurality of third switching devices and to drive the motor by performing pulse-width modulation control on the plurality of first switching devices when a required output of the motor is less than a preset reference value, and to turn off the third switching device and to drive the motor as an open-end winding motor by performing pulse-width modulation control on the first and second switching devices when the required output of the motor is equal to or greater than the reference value.

The preset ratio may be N1:N2, and a coil having a number of turns corresponding to the N1 may be connected to the first inverter in a form of a Y-connection by turning on the third switching device. The N1 may be determined to make a region corresponding to a main driving point of a vehicle to which the motor is applied belong to a region in which a voltage utilization rate of the inverter is equal to or greater than a preset reference value, at which the voltage utilization rate of the inverter is determined to be optimized, in a motor-revolutions-per-minute (RPM)/motor-torque relationship. The preset ratio may be N1:N2, and opposite ends of a coil having a number of turns corresponding to N1+N2 are connected to the first and second inverters by turning off the third switching device, and the motor is driven as an open-end winding motor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a motor-driving apparatus according to exemplary embodiments of the present disclosure will be described with reference to the accompanying drawings.

Figure 1:
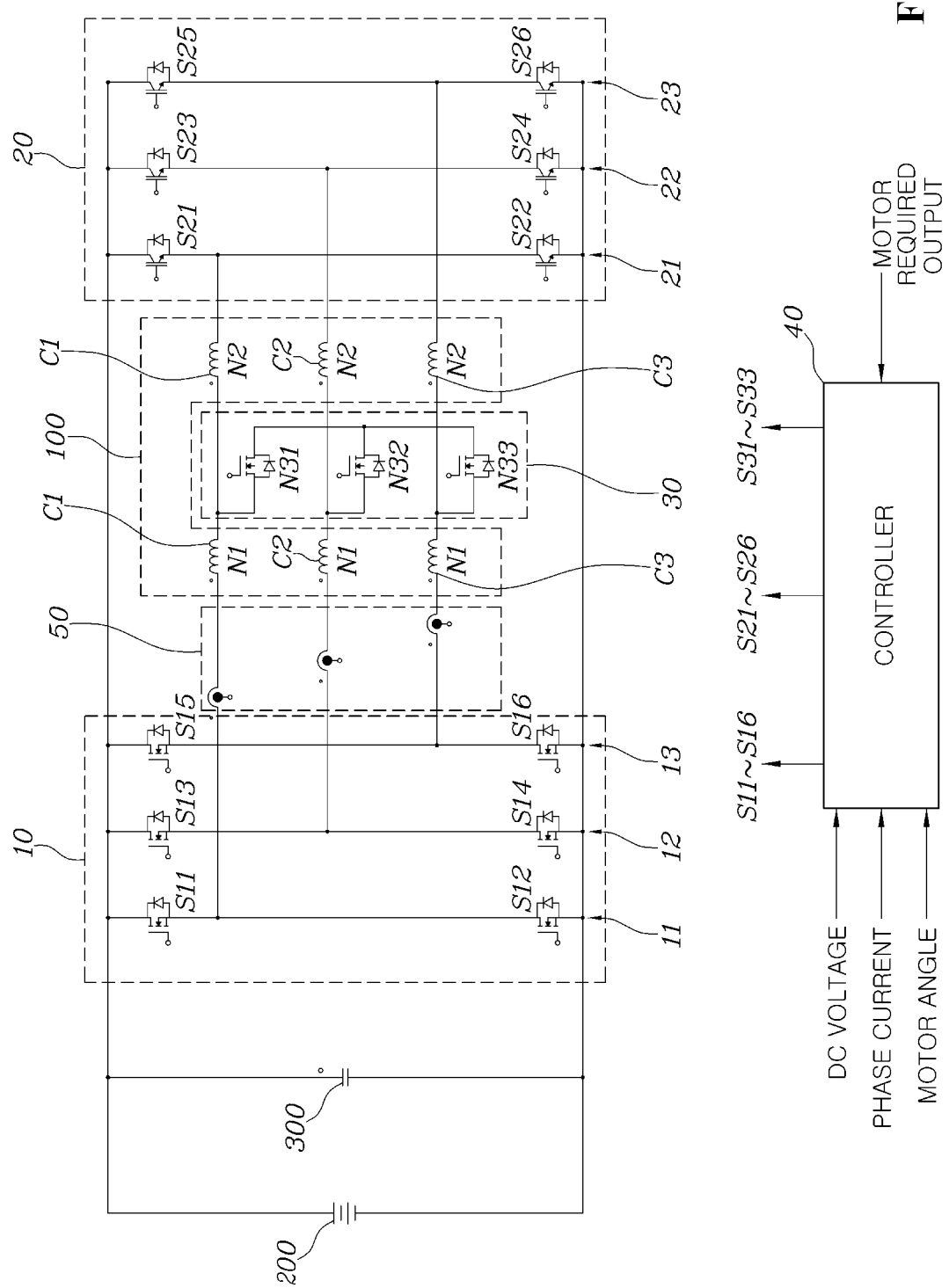
FIG. 1 is a circuit diagram of a motor-driving apparatus according to an exemplary embodiment of the present disclosure.

FIG. 1 is a circuit diagram of a motor-driving apparatus according to an exemplary embodiment of the present disclosure. Referring to FIG. 1, the motor-driving apparatus according to an exemplary embodiment of the present disclosure may be configured to supply driving power to a motor 100 having a plurality of windings C1 to C3 corresponding to a plurality of phases, and may include a first inverter 10, which includes a plurality of first switching devices S11 to S16 and may be connected to a first end of each of the windings of the motor 100, a second inverter 20, which includes a plurality of second switching devices S21 to S26 and may be connected to a second end of each of the windings of the motor 100, third switching devices S31 to S33 for selectively connecting or disconnecting points at which the number of turns of each of the windings of the motor 100 is divided in a preset ratio (N1:N2), and a controller 40 configured to execute an on/off state of the first switching devices S11 to S16, the second switching devices S21 to S26, and the third switching devices S31 to S33 based on the required output of the motor 100.

The first inverter 10 and the second inverter 20 may be configured to convert direct current (DC) power stored in a battery 200 into AC power having three phases and may be configured to provide the converted AC power to the motor 100, or convert the regenerative brake energy generated by generating regenerative brake torque of the motor 100 during regenerative brake into DC power and may be configured to provide the converted DC power to the battery 200. Such conversion between DC power and AC power may be performed via pulse-width modulation control of the plurality of first switching devices S11 to S16 and the plurality of second switching devices S21 to S26, which are included in the first inverter 10 and the second inverter 20, respectively.

The first inverter 10 may include a plurality of legs 11 to 13 to which a DC voltage formed in a DC link capacitor 300 connecting opposite ends of the battery 200 is applied. Electrical connections may be formed in the legs 11 to 13 to correspond to respective ones of the plurality of phases of the motor 100. In particular, the first leg 11 may include the two switching devices S11 and S12, which are connected in series to each other between opposite ends of the DC link capacitor 300, and a connection node of the two switching devices S11 and S12 may be connected to one end (e.g., a first end) of a single-phase winding C1 in the motor 100 to input and output AC power corresponding to one phase among the plurality of phases.

Similarly, the second leg 12 may include the two switching devices S13 and S14, which are connected in series to each other between the opposite ends (e.g., second ends) of the DC link capacitor 300, and a connection node of the two switching devices S13 and S14 may be connected to one end (e.g., a first end) of a single-phase winding C2 in the motor 100 to input and output AC power corresponding to one phase among the plurality of phases. The third leg 13 may include the two switching devices S15 and S16, which are connected in series to each other between the opposite ends (e.g., second ends) of the DC link capacitor 300, and a connection node of the two switching devices S15 and S16 may be connected to one end (e.g., a first end of a single-phase winding C3 in the motor 100 to input and output AC power corresponding to one phase among the plurality of phases.

The second inverter 20 may also have a structure similar to that of the first inverter 10. The second inverter 20 may include a plurality of legs 21 to 23, to which a DC voltage formed in the DC link capacitor 300 connecting the opposite ends of the battery 200 is applied. Electrical connections may be formed in the legs 21 to 23 to correspond to respective ones of the plurality of phases of the motor 100. In particular, the first leg 21 may include the two switching devices S21 and S22, which are connected in series to each other between opposite ends of the DC link capacitor 300, and a connection node of the two switching devices S21 and S22 may be connected to the other end (e.g., a second end) of the single-phase winding C1 in the motor 100 to input and output AC power corresponding to one phase among the plurality of phases.

Similarly, the second leg 22 may include the two switching devices S23 and S24, connected in series to each other between the opposite ends of the DC link capacitor 300, and a connection node of the two switching devices S23 and S24 may be connected to the other end (e.g., second end) of the single-phase winding C2 in the motor 100 to input and output AC power corresponding to one phase among the plurality of phases. The third leg 23 may include the two switching devices S25 and S26, which are connected in series to each other between the opposite ends of the DC link capacitor 300, and a connection node of the two switching devices S25 and S26 may be connected to one end of the single-phase winding C3 in the motor 100 to input and output AC power corresponding to one phase among the plurality of phases.

The first inverter 10 may be connected to one-side ends (e.g., first-side ends) of the windings C1 to C3 of the motor 100, and the second inverter 20 may be connected to other-side ends (e.g., second-side ends) of the windings C1 to C3 of the motor 100. In other words, the opposite ends of the windings C1 to C3 of the motor 100 may be electrically connected to the first inverter 10 and to the second inverter 20, respectively, in an open-end winding method.

According to an exemplary embodiment of the present disclosure, a third switching device 30 may be configured to selectively connect or disconnect points at which the number of turns of each of the plurality of windings C1 to C3 included in the motor 100 is divided in a preset ratio (N1:N2). For example, the third switching device 30 may include a total of three switching devices S31 to S33, one-side ends of the switching devices S31 to S33 may be connected to respective points at which the number of turns of the plurality of windings C1 to C3 is divided in a preset ratio (N1:N2), and the other-side ends of the switching devices S31 to S33 may be connected to each other (N1 and N2 being an actual number of turns).

In such a connection structure, when the third switching device 30 is open, the motor 100 may be operated with a winding having the number of turns N1+N2, and when the third switching device 30 is turned on, the windings C1 to C3 of the motor 100 may be Y-connected to each other at the position to which the third switching device 30 is connected. For example, when the third switching device 30 is turned on, all of the plurality of second switching devices S21 to S26 in the second inverter 20 may be turned off and do not operate, and the first inverter 10 may be operated to driver the motor 100, the motor 100 may be driven as a motor having the number of turns N1. The third switching devices S31 to S33 may employ various switching devices that are known in the art to which the present disclosure pertains, such as a MOSFET, an IGBT, a thyristor, or a relay.

The controller 40 may be a device for pulse-width modulation control of the switching devices S11 to S16 and S21 to S21 included in the first inverter 10 and the second inverter 20 to basically drive the motor 100 based on required output of the motor 100. In particular, according to exemplary embodiments of the present disclosure, the controller 40 may be configured to determine an inverter to be used to drive the motor based on the required output of the motor 100, and accordingly, may be configured to determine the on/off state of the third switching device 30 and may be configured to perform pulse-width modulation control on the switching device of a converter determined to be driven.

In particular, when the required power of the motor 100 is less than a preset reference value, the controller 40 may not operate the second inverter 20, and may be configured to drive the motor 100 via pulse-width modulation control of the switching devices S11 to S16 of the first inverter 10 (for convenience of description, referred to as a 'first driving mode'). The controller 40 may be configured to operate the third switching devices S31 to S33 to be in an on-state. Thus, one-side ends of the windings C1 to C3 of the motor 100, which are connected to the first inverter 10, may be electrically connected to a point at which the number of turns is N1 to form a Y-connection, and the motor 100 may be operated as a motor having a winding with the number of turns N1.

Accordingly, in the first driving mode, the first inverter 10 may be operated to turn on the third switching device 30, and accordingly, control of driving the motor 100 in which a winding with the number of turns N1 is Y-connected may be performed. The motor may be driven in the first driving mode by receiving phase current provided to the motor 100, detected by a DC voltage and current sensor 50 of the first inverter 10, and a motor angle, etc. detected by a motor rotor sensor (not shown) installed in the motor 100 and performing pulse-width modulation control on the first switching devices S11 to S16 of the first inverter 10 by the controller 40. Various schemes for driving the motor 100 via pulse-width modulation control on one inverter are already known in the art to which the present disclosure pertains, and thus, a detailed description of a scheme of pulse-width modulation control of the inverter in the first driving mode will not be given any longer.

When the required power of the motor 100 is greater than a preset reference value, the controller 40 may be configured to operate both the first inverter 10 and the second inverter 20 and may be configured to operate the motor 100 (for convenience of description, referred to as a 'second driving mode'). In particular, the controller 40 may be configured to operate the third switching devices S31 to S33 to be in an off-state. Thus, each of the windings Cl to C3 of the motor 100 may have the number of turns N1+N2, one-side ends of the windings C1 to C3 may be connected to the first inverter 10, the other-side ends of the windings C1 to C3 may be connected to the second inverter 20. In other words, in the second driving mode, the motor 100 may be an open-end winding motor in the state in which opposite ends of all of the windings C1 to C3 are open, and may be driven via pulse-width modulation control of the two inverters 10 and 20, which are connected to opposite ends of the windings C1 to C3, respectively.

The motor may be driven in the second driving mode by receiving phase current provided to the motor 100, detected by the DC voltage and current sensor 50 of the first inverter 10 and the second inverter 20, and a motor angle, etc. detected by a motor rotor sensor (not shown) installed in the motor 100 and performing pulse-width modulation control on the first switching devices S11 to S16 of the first inverter 10 and the second switching devices S21 to S26 of the second inverter 20 by the controller 40. Various schemes for driving a motor via pulse-width modulation control on two inverters connected to opposite ends of a winding of an open-end winding motor are already known in the art to which the present disclosure pertains, and thus, a detailed description of pulse-width modulation control of the inverter in the second driving mode will not be given any longer.

Figure 2:
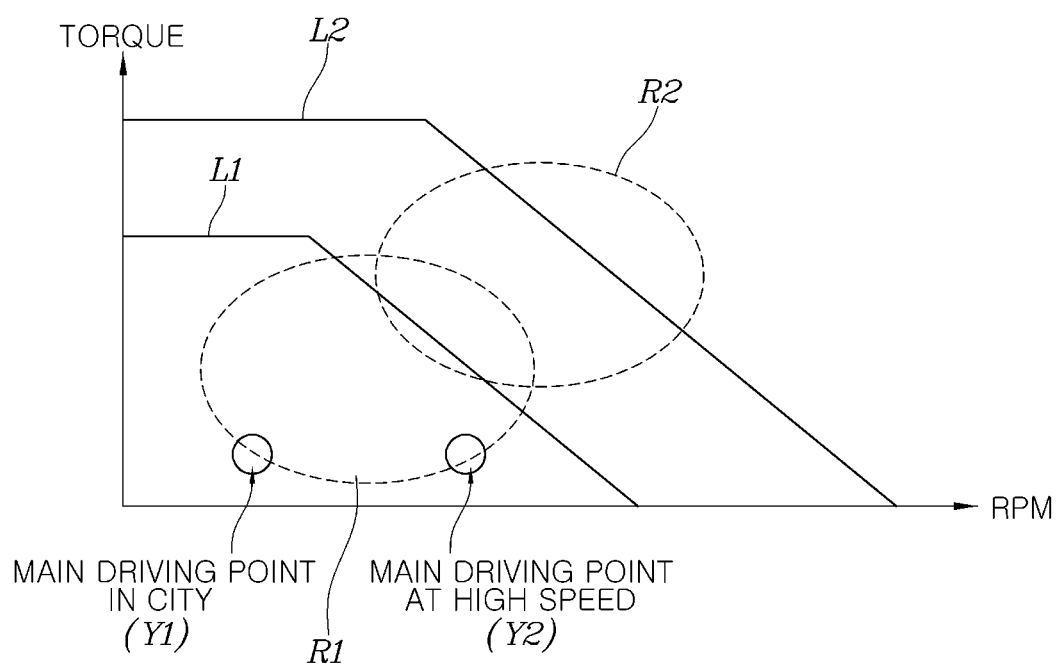
FIG. 2 is a diagram showing a motor-revolutions-per-minute (RPM)/motor-torque curve and a high-efficiency region for each motor-driving mode of a motor-driving apparatus according to an exemplary embodiment of the present disclosure.

FIG. 2 is a diagram showing a motor-revolutions-per-minute (RPM)/motor-torque curve and a high-efficiency region for each motor-driving mode of a motor-driving apparatus according to an exemplary embodiment of the present disclosure. As described above, the motor-driving apparatus according to an exemplary embodiment of the present disclosure may be configured to drive a Y-connected motor having a number of turns N1 by operating the first inverter 10 in the first driving mode, and may be configured to drive an open-end winding motor having a number of turns N1+N2 by operating the first inverter 10 and the second inverter 20 in the second driving mode.

As shown in FIG. 2, when the motor 100 is applied to driving of a vehicle, a main vehicle driving point may be represented by a driving point Y1 while traveling in a city and a driving point Y2 while traveling on an expressway, and the driving points Y1 and Y2 may belong to a region having high efficiency of a motor-inverter system. According to an exemplary embodiment of the present disclosure, when the motor 100 is applied to a vehicle, the number of turns N1 may be determined in such a way that the main driving points Y1 and Y2 are included in a region with high efficiency of the motor-inverter system in the first driving mode. The efficiency of the motor-inverter system may be determined by the voltage utilization rate of the inverter, and thus the number of turns N1 of the windings C1 to C3 of the motor 100 in the first driving mode may be determined in such a way that the main driving points Y1 and Y2 of the vehicle belongs to a region R1 in which a voltage utilization rate of the inverter is equal to or greater than a preset reference value, at which the voltage utilization rate of the inverter is determined to be optimized.

The second driving mode may be a mode for driving an open-end winding motor, and as is known, in the open-end winding driving, it may be possible to set the output of an inverter to be $\sqrt{3}$ times greater than in the case in which a motor of Y-connected windings having the same number of turns is simply driven using one inverter. In other words, when open-end winding driving that is the second driving mode is applied, it may be possible to increase the number of turns of the motor by $\sqrt{3}$ times, and thus current required for achieving the same output from the motor may be reduced by $\sqrt{3}$ times.

Accordingly, when the open-end winding driving method is applied, the current of the inverter may be reduced, thereby improving efficiency, and the cost of material may be reduced due to reduction in the usage of a power semiconductor applied as a switching device for outputting the same output, compared with driving of the Y-connected motor.

As shown in FIG. 2, when the second driving mode is applied, it may be difficult to adjust the main driving points Y1 and Y2 to fall within a region R2 in which a voltage utilization rate of the motor-inverter system is equal to or greater than a preset reference value, at which the voltage utilization rate of the motor-inverter system is determined to be optimized as the output of the motor is increased. Thus, as described above, in the low-torque region to which the main driving points Y1 and Y2 belong, the motor 100 may be driven and the efficiency thereof may be improved in the first driving mode, and the motor 100 may be driven in the second driving mode in a section that requires high output, and accordingly, the motor 100 may be driven to reduce output current of the inverter and to reduce the usage of a power semiconductor.

In order to further improve the efficiency of the first driving mode, executed in the low-torque region to which the main driving points Y1 and Y2 belong, the switching devices S11 to S16 applied to the first inverter 10 may employ a MOSFET formed of SiC, which is a material characterized by relatively low switching loss. In contrast, the switching devices S21 to S26 applied to the second inverter 20, which is operated in a high-output region may employ IGBT formed of Si, which is an inexpensive material.

As described above, the motor-driving apparatus according to various exemplary embodiments of the present disclosure may be configured to determine whether a number of turns of windings of the motor is divided based on required output of the motor, improve system efficiency by dividing the number of turns of the windings in a low-output section to adjust a main driving point of the vehicle to be within a high-efficiency section of the motor-inverter system, and may be configured to realize high torque with relatively low current using the total number of turns of the windings in a high-output section. Thus, the motor-driving apparatus according to various exemplary embodiments of the present disclosure may have improved efficiency, and may contribute to improving the fuel efficiency of the vehicle in the entire torque section compared with the conventional case, in which a general Y-connected motor is driven using one inverter.

The motor-driving apparatus may be configured to determine whether the number of turns of windings of the motor is divided based on the required output of the motor, may improve system efficiency by dividing the number of turns of the windings in a low-output section to make the main driving point of the vehicle belong to a high-efficiency section of the motor-inverter system, and may realize high torque with low current using the total number of turns of the windings in a high-output section. Thus, the motor-driving apparatus may have improved efficiency, and may contribute to improving the fuel efficiency of the vehicle in the entire torque section, compared with a conventional case in which a general Y-connected motor is driven using one inverter.

It will be appreciated by those skilled in the art that the effects achievable through the present disclosure are not limited to those that have been particularly described hereinabove, and that other unmentioned effects of the present disclosure will be more clearly understood from the above detailed description.

Although the exemplary embodiments of the present disclosure have been disclosed for illustrative purposes, those skilled in the art will appreciate that various modifications, additions and substitutions are possible, without departing from the scope and spirit of the invention as disclosed in the accompanying claims.

What is claimed is:

1. A motor-driving apparatus for driving a motor having a plurality of windings corresponding to a plurality of phases, respectively, comprising:
    a first inverter including a plurality of first switching devices and connected to first ends of the plurality of windings;
    a second inverter including a plurality of second switching devices and connected to second ends of the plurality of windings;
    a third switching device configured to selectively connect and disconnect points at which a number of turns of each of the windings is divided in a preset ratio; and
    a controller configured to adjust an on/off state of the first to third switching devices based on a required output of the motor;
    wherein the third switching device includes a plurality of switching devices having first-side ends connected to points at which a number of turns of each of the plurality of windings is divided in the preset ratio, respectively, and the second-side ends connected to each other.

2. The motor-driving apparatus of claim 1, wherein, when the required output of the motor is less than a preset reference value, the controller is configured to turn on the third switching device and drive the motor by performing pulse-width modulation control on the first switching device.

3. The motor-driving apparatus of claim 2, wherein the preset ratio is N1:N2, and a coil with a number of turns corresponding to the N1 is connected to the first inverter in a form of a Y-connection by turning on the third switching device.

4. The motor-driving apparatus of claim 3, wherein the N1 is determined to make a region corresponding to a main driving point of a vehicle to which the motor is applied belong to a region in which a voltage utilization rate of the inverter is equal to or greater than a preset reference value, at which the voltage utilization rate of the inverter is determined to be optimized, in a motor-revolutions-per-minute (RPM)/motor-torque relationship.

5. The motor-driving apparatus of claim 1, wherein, when the required output of the motor is greater than a preset reference value, the controller is configured to turn off the third switching device and drive the motor by performing pulse-width modulation control on the first switching device and the second switching device.

6. The motor-driving apparatus of claim 5, wherein the preset ratio is N1:N2, and opposite ends of a coil having a number of turns corresponding to N1+N2 are connected to the first and second inverters by turning off the third switching device, and the motor is driven as an open-end winding motor.

7. A motor-driving apparatus for driving a motor having a plurality of windings corresponding to a plurality of phases, respectively, comprising:
    a first inverter including a plurality of first switching devices and connected to first ends of the plurality of windings;
    a second inverter including a plurality of second switching devices and connected to second ends of the plurality of windings;
    a plurality of third switching devices having first-side ends connected to points at which a number of turns of the plurality of windings is divided in a preset ratio, respectively, and having second-side ends connected to each other; and
    a controller configured to form a Y-connection by turning on the plurality of third switching devices and to drive the motor by performing pulse-width modulation control on the plurality of first switching devices when a required output of the motor is less than a preset reference value, and to turn off the third switching device and to drive the motor as an open-end winding motor by performing pulse-width modulation control on the first and second switching devices when the required output of the motor is equal to or greater than the reference value.

8. The motor-driving apparatus of claim 7, wherein the preset ratio is N1:N2, and a coil having a number of turns corresponding to the N1 is connected to the first inverter in a form of a Y-connection by turning on the third switching device.

9. The motor-driving apparatus of claim 8, wherein the N1 is determined to make a region corresponding to a main driving point of a vehicle to which the motor is applied belong to a region in which a voltage utilization rate of the inverter is equal to or greater than a preset reference value, at which the voltage utilization rate of the inverter is determined to be optimized, in a motor-revolutions-per-minute (RPM)/motor-torque relationship.

10. The motor-driving apparatus of claim 7, wherein the preset ratio is N1:N2, and opposite ends of a coil having a number of turns corresponding to N1+N2 are connected to the first and second inverters by turning off the third switching device, and the motor is driven as an open-end winding motor.

* * * * *